United States Patent [19]

Schwarz et al.

[11] 4,439,743

[45] Mar. 27, 1984

[54] BIASING CIRCUIT FOR POWER AMPLIFIER

[75] Inventors: Manfred Schwarz, Grunbach, Fed. Rep. of Germany; Tadashi Higuchi, Tokyo, Japan

[73] Assignee: Sony Corporation, Tokyo, Japan

[21] Appl. No.: 257,390

[22] Filed: Apr. 24, 1981

[30] Foreign Application Priority Data

Apr. 30, 1980 [JP] Japan ................................. 55-58415

[51] Int. Cl.³ ............................................. H03F 3/26
[52] U.S. Cl. ................................... 330/267; 330/296; 330/273
[58] Field of Search .............. 330/267, 268, 269, 270, 330/273, 274, 296, 288

[56] References Cited

U.S. PATENT DOCUMENTS 4,274,059 6/1981 Okabe ................................. 330/268

OTHER PUBLICATIONS

Hikaru Kondo, "Nuevo Concepto en Amplificadores de Potencia Pava Audio", Nundo Electronico, 1980, No. 102.

Primary Examiner—James B. Mullins
Assistant Examiner—Gene Wan

Attorney, Agent, or Firm—Lewis H. Eslinger; Alvin Sinderbrand

[57] ABSTRACT

A biasing circuit for a non-switching type power amplifier includes first and second DC voltage supply terminals; at least one input resistor; first and second output resistors; first and second output transistors, each having a main current path and an input electrode, the input electrodes of which are connected to the at least one input resistor, and the main current paths of which are connected in series between the first and second DC voltage supply terminals through the first and second output resistors, the connection point of the first and second output resistors constituting a signal output terminal; a signal input circuit for supplying an input signal to the input electrodes of the first and second output transistors, through the at least one input resistor; third and fourth DC voltage supply terminals; a series circuit comprised of a at least one input variable current source, the first resistor and a second variable current source, the series circuit being connected between the third and fourth DC voltage supply terminals; a voltage detecting circuit for detecting one of the voltages across the first and second output resistors or one of the voltages supplied to the input electrodes of the first and second output transistors; and a control circuit for controlling at least one of the first and second variable current sources in accordance with the detected output of the voltage detecting circuit.

42 Claims, 9 Drawing Figures

FIG. 8

BIASING CIRCUIT FOR POWER AMPLIFIER

BACKGROUND OF THE INVENTION

1. Field of the Invention

The present invention relates generally to a biasing circuit for a power amplifier, and more particularly, is directed to a biasing circuit for a non-switching type power amplifier.

2. Description of the Prior Art

In the prior art, various biasing circuits for Class AB power amplifiers have been proposed in which, in order to reduce the generation of switching distortion, a biasing voltage is varied or modulated in accordance with the amplitude of an output signal to render the circuit of the non-switching type.

With such prior art biasing circuits, however, when the biasing voltage is modulated in accordance with the amplitude of the output signal, a problem of non-linear distortion being generated in the biasing circuit may arise as a result of the existence of a non-linear element, such as a transistor or the like, in the signal transmission path.

Further, according to such prior art biasing circuits for the type AB-class power amplifier, if a MOS-FET (field effect transistor) is used as an amplifying element in a power amplifying stage, non-linear distortion is generated in the range where the mutual conductance of the MOS-FET is relatively small. However, no biasing circuit for the above described power amplifier, in which the generation of such non-linear distortion is removed, has been proposed.

OBJECTS AND SUMMARY OF THE INVENTION

Accordingly, it is an object of the present invention to provide a biasing circuit for a power amplifier that avoids the above-described difficulties encountered with the prior art.

More particularly, it is an object of the present invention to provide a biasing circuit for a power amplifier which does not include a non-linear element in the signal transmission path of the biasing circuit.

A further object of the present invention is to provide a biasing circuit for a power amplifier which is effective when a MOS-FET is used as an output transistor.

In accordance with one embodiment of the present invention, a biasing circuit for a power amplifier includes:

signal input means for supplying an input signal; output transistor means including first and second output transistors for amplifying the input signal, each of the transistors including an output path and an input; output resistive means including first and second resistive elements connected in series between the output paths of the first and second output transistors; first and second variable current source means; input resistive means connected between the first and second variable current source means for supplying the input signal to the inputs of the first and second output transistors; and control means for detecting the voltage at one of the output transistor means and the output resistive means and for controlling at least one of the first and second variable current source means in response to such detection.

The above, and other objects, features and advantages of the present invention will be apparent from the following detailed description of illustrative embodiments of the invention which is to be read in connection with the accompanying drawings.

DETAILED DESCRIPTION OF THE PREFERRED EMBODIMENTS

In order to facilitate a better understanding of the present invention, a prior art non-switching type biasing circuit for a power amplifier will first be described with reference to FIG. 1.

Figure 1:
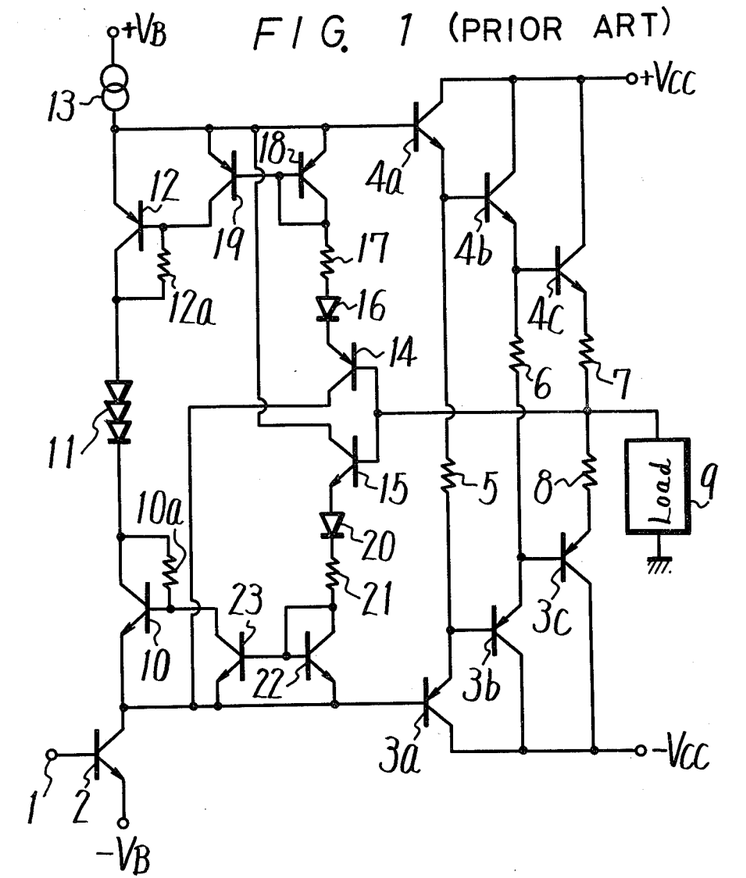
FIG. 1 is a circuit wiring diagram showing an example of a prior art biasing circuit for a power amplifier.

In FIG. 1, an audio signal is supplied through an audio signal input terminal 1 to the base of an NPN transistor 2 which has its emitter connected to a negative voltage supply terminal supplied with a negative DC voltage $-V_B$, and its collector connected to the base of a PNP transistor 3a. This latter transistor forms an SEPP (single-ended push-pull) circuit together with PNP transistors 3b and 3c connected in a Darlington configuration and three NPN transistors 4a, 4b and 4c also connected in a Darlington configuration. In other words, collectors of the transistors 3a, 3b and 3c are commonly connected to a negative power supply terminal supplied with a negative DC voltage $-V_{CC}$, and the collectors of transistors 4a, 4b and 4c are commonly connected to a positive power supply terminal supplied with a positive DC voltage $+V_{CC}$. The transistor 3a has its emitter connected to the base of transistor 3b and also through a resistor 5 to the connection point between the emitter of transistor 4a and the base of transistor 4b. The transistor 3b has its emitter connected to the base of transistor 3c and also through a resistor 6 to the connection point between the emitter of transistor 4b and the base of transistor 4c, the emitter of which is connected to the emitter of transistor 3c through a series connection of resistors 7 and 8. The connection point between resistors 7 and 8 is grounded through a load 9 such as a speaker.

The collector of transistor 2 is also connected to the emitter of an NPN transistor 10 forming an active bias circuit. The transistor 10 has its collector connected through a resistor 10a to its base and also through a temperature compensating diode 11 to the collector of a PNP transistor 12 forming an active bias circuit. The transistor 12 has its collector connected through a resistor 12a to its base and its emitter connected to the base of transistor 4a of the SEPP circuit and also through a constant current circuit 13 to a positive power supply terminal supplied with a positive DC voltage $+V_B$.

The connection point between resistors 7 and 8 is connected to the bases of PNP and NPN transistors 14 and 15 each of which forms a current detecting circuit.

The emitter of transistor 14 is connected through a series connection of a diode 16, which is arranged in the forward biasing direction so that the cathode thereof is connected to the emitter of transistor 14, and a resistor 17, to the connection point between the base and collector of a PNP transistor 18 which forms a current mirror circuit together with a PNP transistor 19. The emitter of transistor 18 is connected to the base of transistor 4a, and the connection point of the base and collector of transistor 18 is connected to the base of transistor 19 which has its emitter also connected to the base of transistor 4a and its collector connected to the base of transistor 12. The collector of transistor 14 is connected to the base of transistor 3a. In this case, the same current flowing through the main current path of transistor 18 also flows through the main current path of transistor 19. In like manner, the emitter of transistor 15 is connected through a series connection of a diode 20 which is arranged in the forward biasing direction so that the anode thereof is connected to the emitter of transistor 15, and a resistor 21, to the connection point between the base and collector of an NPN transistor 22 which forms a current mirror circuit together with an NPN transistor 23. The emitter of transistor 22 is connected to the base of transistor 3a, and the connection point of the base and collector of transistor 22 is connected to the base of transistor 23 which has its emitter also connected to the base of transistor 3a and its collector connected to the base of the transistor 10. The collector of transistor 15 is connected to the base of transistor 4a. In this case, the same current flowing through the main current path of transistor 22 also flows through the main current path of transistor 23.

Figure 2:
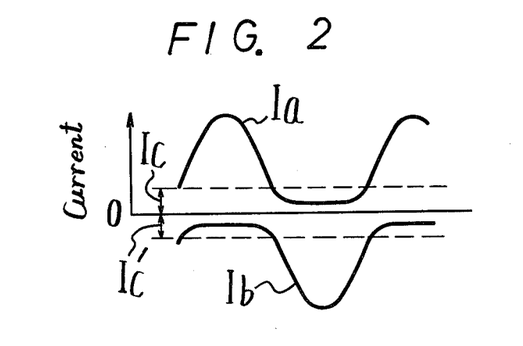
FIG. 2 is a waveform diagram used to explain the operation of the circuit shown in FIG. 1.

With the prior art circuit shown in FIG. 1, when an input in the positive direction, that is, a positive half cycle, is applied thereto, the currents flowing through NPN transistors 4a, 4b and 4c increase and a voltage $V_a$ between the base of transistor 4a and the output terminal, that is, the connection point of resistors 7 and 8 increases. At this time, the current detecting circuit is formed of the series connection of transistor 18, resistor 17, diode 16 and transistor 14, and the detected voltage variation appears across both ends of the respective resistors 12a and 17. In other words, if it is assumed that the voltage variation across the base and emitter of each of transistors 14 and 18, and across the anode and cathode of diode 16, are given as $\Delta V_{BE}$, a voltage variation $\Delta V_{B1}$, which is obtained by subtracting $3\Delta V_{BE}$ from the voltage variation $\Delta V_a$ between the base of transistor 4a and the connection point of resistors 7 and 8, appears across each of resistors 12a and 17, and accordingly, across the collector and emitter of transistor 12. As a result, the bias voltage between the base of transistor 3a and the output terminal, that is, the connection point of resistors 7 and 8, is reduced by $3\Delta V_{BE}$. On the other hand, when an input in the negative direction, that is, a negative half cycle, is applied to the circuit, the currents flowing through PNP transistors 3a, 3b and 3c increase and a voltage $V_b$ between the base of transistor 3a and the output terminal, that is, the connection point of resistors 7 and 8 increases. At this time, the current detecting circuit is formed of the series connection of transistor 22, resistor 21, diode 20 and transistor 15 and operates in a similar manner to the above case. A voltage variation, which is obtained by subtracting $3\Delta V_{BE}$ from the voltage variation $\Delta V_b$ between the base of transistor 3a and the connection point of resistors 7 and 8, appears across resistor 10a, and accordingly, across the collector and emitter of transistor 10. As a result, the bias voltage between base of the transistor 4a and the output terminal, that is, the connection point of resistors 7 and 8, is reduced by $3\Delta V_{BE}$. Accordingly, emitter currents $I_a$ and $I_b$ of the respective transistors 4c and 3c, are obtained, as shown in FIG. 2, respectively, to thereby produce a composite output waveform having a non-switching distortion. In FIG. 2, the values $I_c$ and $I_c'$ represent idling currents of transistors 4c and 3c, respectively.

According to the prior circuit shown in FIG. 1, since transistors 10 and 12, which are both non-linear elements, are inserted into the signal transmission path, a problem of non-linear distortion results. Also, in such case, a voltage drive element, such as a MOS-FET, can not be used as the output transistor.

According to the present invention, the above non-linear distortion is removed and a voltage drive transistor, such as a MOS-FET, can be employed in the power amplifier.

A fundamental embodiment of the biasing circuit for a power amplifier according to the present invention will now be described with reference to FIG. 3 in which reference designators which are the same as those used in FIG. 1 represent the same elements and a detailed description thereof will be omitted.

Figure 3:
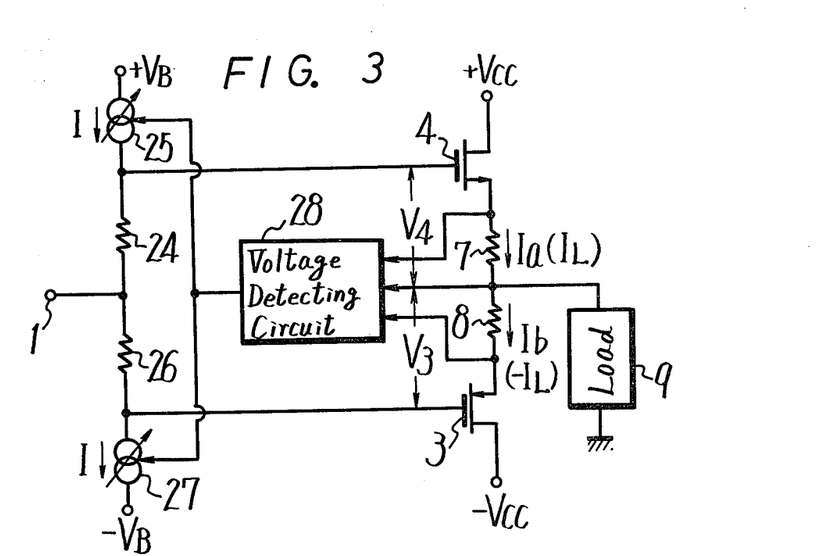
FIG. 3 is a circuit wiring diagram showing a fundamental biasing circuit for a power amplifier according to one embodiment of the present invention.

In the embodiment of the invention shown in FIG. 3, the audio signal input terminal 1 is connected through a bias voltage determining resistor 24 to the gate of an N-channel MOS-FET 4 which, together with a P-channel MOS-FET 3, forms the SEPP circuit. The connection point between resistor 24 and the gate of MOS-FET 4 is connected through a variable current source 25 to the power supply terminal supplied with the positive DC voltage $+V_B$. The audio signal input terminal 1 is also connected through a bias voltage determining resistor 26 to the gate of MOS-FET 3, and the connection point between resistor 26 and the gate of MOS-FET 3 is connected through a variable current source 27 to the negative power supply terminal supplied with the negative DC voltage $-V_B$. The drain of MOS-FET 4 is connected to the positive power supply terminal supplied with the positive DC voltage $+V_{CC}$, and the drain of MOS-FET 3 is connected to the negative power supply terminal supplied with the negative DC voltage $-V_{CC}$. A series connection of resistors 7 and 8 is inserted between the sources of the respective MOS-FETs 4 and 3. The connection point between resistors 7 and 8 is grounded through a load 9, such as a speaker or the like, and is also connected to a common terminal of a voltage detecting circuit 28. The connection point between the source of MOS-FET 4 and resistor 7 and the connection point between the source of MOS-FET 3 and resistor 8 are both connected to respective inputs of voltage detecting circuit 28. The detected signal obtained at the output of voltage detecting circuit 28 is supplied to variable current sources 25 and 27 to simultaneously or separately control the currents thereof. In this case, if it is assumed that the resistance values of resistors 7 and 8 are each equal to $R_S$, the current flowing through resistor 7 is equal to $I_L$, the current flowing through resistor 8 is equal to $-I_L$, the currents of variable current sources 25 and 27 are each equal to I, and the resistance values of resistors 24 and 26 are each equal to R, then a voltage of $I_L \cdot R_S$ is detected by voltage detecting circuit 28. The detected output therefrom is used to control the current I of the respective variable current sources 25 and 27. At this time, the bias voltage of MOS-FETs 3 and 4 is determined by I·R. Thus, the current is adjusted so that when no signal is applied the following equation is satisfied:

$$2I \cdot R = V_{GS+} + V_{GS-} + 2 \cdot I_L \cdot R_S$$

where $V_{GS+}$ is the voltage between the gate and source of MOS-FET 4 and $V_{GS-}$ is the voltage between the gate and source of MOS-FET 3.

When a positive half cycle of an input signal is fed to audio signal input terminal 1, if it is assumed that the current flowing through MOS-FET 4 is varied from $I_L$ to $I_L + \Delta I_L$ and the current of the variable current sources 25 and 27 is varied from I to $I + \Delta I$, the sum of the gate-source voltages of MOS-FETs 4 and 3 is expressed as follows:

$$V_{GS+} + V_{GS-} = 2I \cdot R + 2\Delta I \cdot R - \Delta I_L \cdot R_S - 2I_L \cdot R_S \quad (1)$$

In such case, accompanying the increase of $\Delta I_L$, $V_{GS+}$ is varied as follows:

$$\Delta V_{GS} = (\Delta I_L / g_m)$$

Since, however, the value of $g_m$ of MOS-FET 4 is sufficiently large, $\Delta V_{GS}$ can be neglected. Accordingly, in order to avoid MOS-FET 3 being cut off when MOS-FET 4 is turned ON, it is determined from equation (1) that the following equation (2) should be satisfied:

$$\Delta I = ((\Delta I_L \cdot R_S)/2R) \quad (2)$$

If $\Delta I$ is selected to satisfy the above equation (2), $V_{GS+}$ and $V_{GS-}$ become approximately constant and MOS-FET 3 is not cut off.

On the other hand, when the negative half cycle of the input signal is applied to input terminal 1, if equation (2) is satisfied, MOS-FET 4 is not cut off when MOS-FET 3 turns ON in a similar manner to the above case.

According to the present invention, the circuit is constructed so that the relation of the detected output signal from voltage detecting circuit 28 to the current of variable current sources 25 and 27 satisfies the equation (2).

Figure 4A:
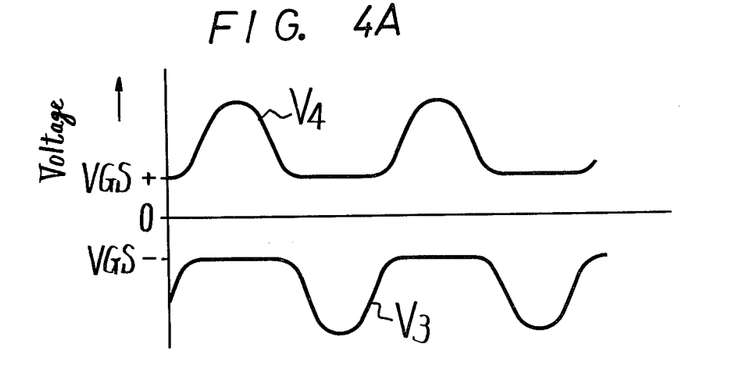
FIGS. 4A and 4B are waveform diagrams used to explain the operation of any of the biasing circuits according to the present invention.
Figure 4B:
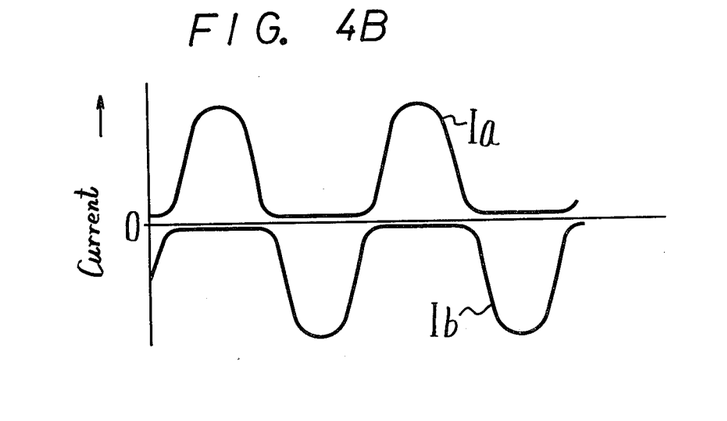

With the present invention constructed as above, a voltage $V_4$ between the gate of MOS-FET 4 and the connection point of resistors 7 and 8, that is, the output terminal, and a voltage $V_3$ between the gate of MOS-FET 3 and the output terminal, are respectively varied as shown in FIG. 4A. As a result, the currents $I_a$ and $I_b$ flowing through MOS-FETs 4 and 3 are respectively varied as shown in FIG. 4B which shows that MOS-FETs 4 and 3 are not cut off. Further, since the variable current sources 25 and 27 are always controlled by the output signal from voltage detecting circuit 28 so as to control the bias voltages for MOS-FETs 4 and 3, the continuity between the upper (positive half-cycle) and lower (negative half-cycle) waves of the current flowing through load 9 is smooth. In this manner, a composite output waveform, in which generation of switching distortion and cross-over distortion is suppressed and which thereby has a low distortion, can be obtained.

According to the present invention, the audio signal applied to audio signal input terminal 1 is supplied to the gates of MOS-FETs 4 and 3, which form the output transistor circuit, through resistors 24 and 26 which are each a linear element. In other words, the audio signal is not supplied through non-linear element such as a transistor, so that any non-linear distortion caused by such non-linear element is not generated. Further, with the present invention, the circuit can be voltage-driven so that MOS-FETs 4 and 3, each being a high speed switching element, can be employed.

In addition, according to the present invention, the amount of variation of current flowing from variable current source 25 is set equal to that flowing into variable current source 27, whereby the bias circuit does not become a load at the former stage.

Figure 5:
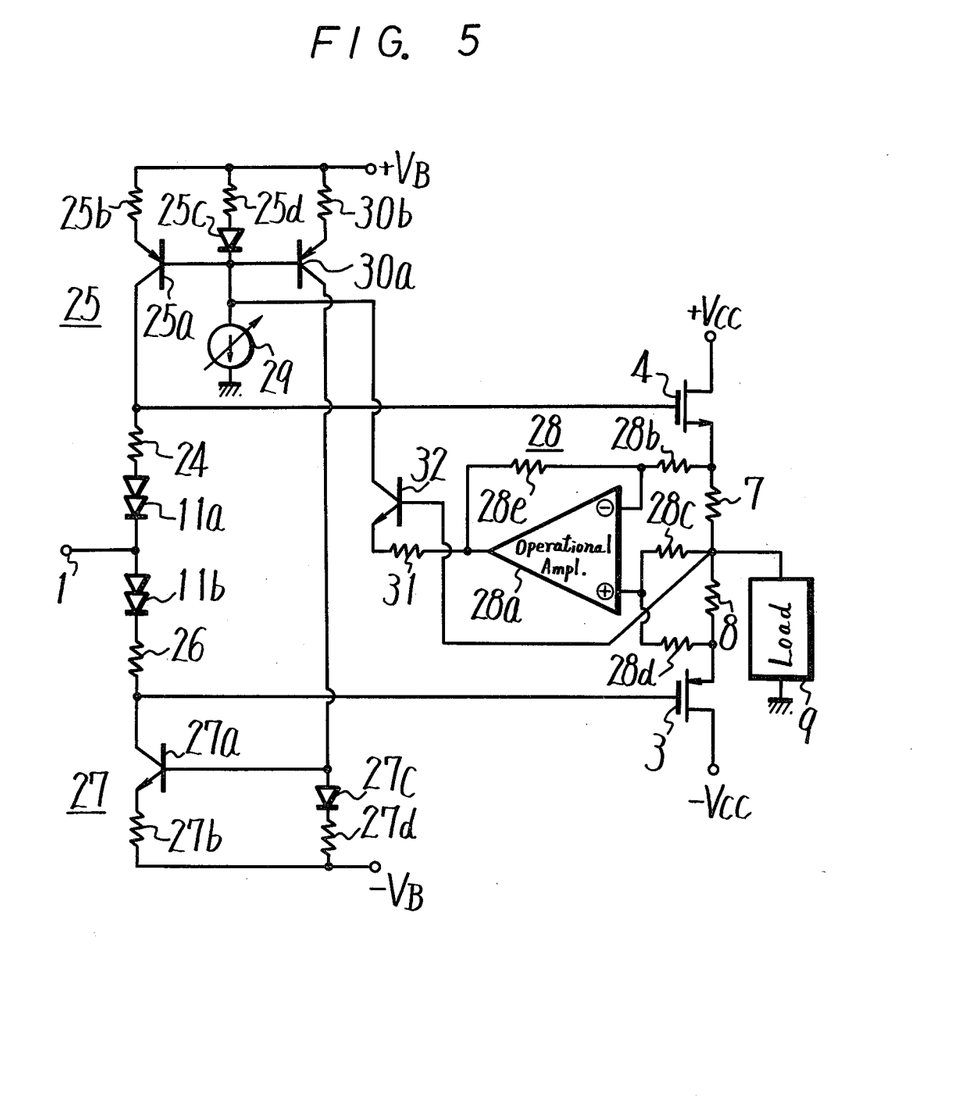
FIG. 5 is a circuit wiring diagram showing a biasing curcuit for a power amplifier according to another embodiment of the present invention.
Figure 6:
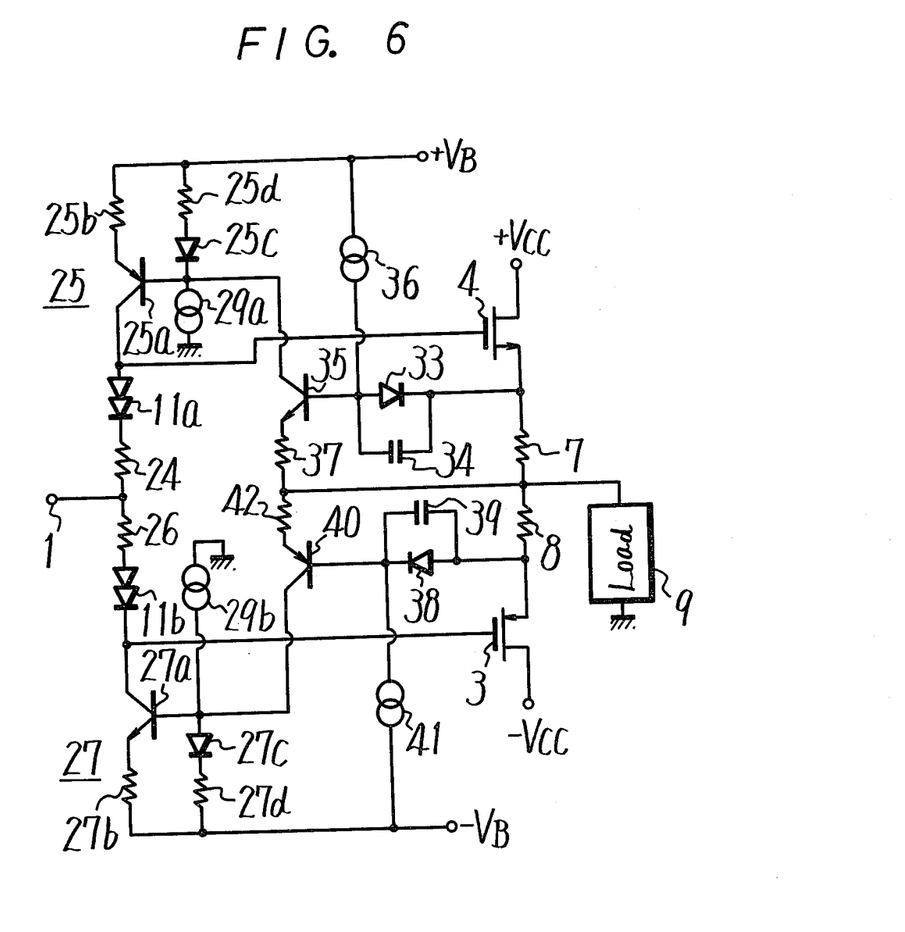
FIGS. 6 to 8, inclusive, are circuit wiring diagrams showing biasing circuits for power amplifiers according to other embodiments of the present invention.

FIGS. 5 and 6 respectively show other practical embodiments of the invention in which parts and elements corresponding to those of FIG. 3 are identified by the same reference numerals and a detailed description thereof will be omitted.

In the embodiment of the invention shown in FIG. 5, the audio signal input terminal 1 is connected through a series connection of a temperature compensating diode 11a and a bias voltage determining resistor 24 to the gate of N-channel MOS-FET 4 which forms, together with P-channel MOS-FET 3, forms the SEPP circuit. The connection point between resistor 24 and the gate of MOS-FET 4 is also connected to the collector or control output electrode of a PNP transistor 25a which forms the variable current source 25. The transistor 25a has its emitter connected through a resistor 25b to the positive power supply terminal supplied with the positive DC voltage $+V_B$ and its base connected through a series connection of a diode 25c and a resistor 25d to the aforementioned positive power supply terminal and through a bias determining constant current circuit 29 to ground. In this case, the constant current circuit 29 is constructed so that its current can be adjusted, and transistor 25a and diode 25c form a current mirror circuit.

Further, audio signal input terminal 1 is connected through a series connection of a temperature compensating diode 11b and a bias voltage determining resistor 26 to the gate of P-channel MOS-FET 3. The connection point between resistor 26 and the gate of MOS-FET 3 is connected to the collector of an NPN transistor 27a. The transistor 27a has its emitter connected through a resistor 27b to the negative power supply terminal supplied with the negative DC voltage $V_B$ and base connected through a series connection of a diode 27c and a resistor 27d to the aforementioned negative power supply terminal. The transistor 27a and diode 27c form a current mirror circuit. The connection point between diode 25c and constant current circuit 29 is connected to the base of a PNP transistor 30a which has its emitter connected through a resistor 30b to the positive power supply terminal $+V_B$ and its collector serving as the output electrode and being connected to the connection point of the base of transistor 27a and diode 27c. In this case, diode 25c and transistor 25a form a current mirror circuit, as previously discussed and diode 25c and transistor 30a also form a current mirror circuit. Further, diode 27c supplied with the output current from transistor 30a, and transistor 27a, form a current mirror circuit, as previously discussed. Therefore, the currents respectively flowing through transistors 25a, 30a and 27a are equal.

The connection point between source of the MOS-FET 4 and resistor 7 is connected through a resistor 28b to the negative or inverting input terminal $\ominus$ of an operational amplifier circuit 28a which forms the voltage detecting circuit 28. The connection point between resistors 7 and 8 is connected through a resistor 28c to the positive or non-inverting input terminal ⊕ of operational amplifier circuit 28a. The connection point between the source of MOS-FET 3 and resistor 8 is connected through a resistor 28d to the positive input terminal ⊕ of operational amplifier circuit 28a and the output terminal of the latter circuit is connected to the negative input terminal ⊖ thereof through a feedback resistor 28e. In this case, at the output terminal of operational amplifier circuit 28a, there is obtained a voltage in response to the voltage drop across resistors 7 and 8. The output terminal of operational amplifier circuit 28a is connected through a resistor 31 to the emitter of an NPN transistor 32 which forms a voltage-current converting circuit, and the connection point between resistors 7 and 8 is connected to the base of transistor 32, the collector of which is connected to the connection point of diode 25c constant current circuit 29. In this case, at the collector of transistor 32, there is obtained a current in response to the voltage drop across resistors 7 and 8. This current is applied to diode 25c, which forms part of the current mirror circuit, as previously set forth, to thereby control the current flowing therethrough. Accordingly, the currents flowing through transistors 25a, 30a and 27a can be controlled by the current from transistor 32.

Also, in the embodiment of the invention shown in FIG. 5, the voltage $V_4$ between the gate of MOS-FET 4 and the connection point of resistor 7 to resistor 8, that is, the output terminal, and the voltage $V_3$ between the gate of MOS-FET 3 and the output terminal, are varied as shown in FIG. 4A. Therefore, the currents $I_a$ and $I_b$ flowing through MOS-FETs 4 and 3 are varied as shown in FIG. 4B, so that MOS-FETs 4 and 3 are not cut off. Further, since the respective currents of transistors 25a and 27a of the current mirror circuits forming the variable current sources are controlled by the control current from operational amplifier circuit 28a forming the voltage detecting circuit 28 and the transistor 32 forming the voltage-current converting circuit to thereby control the bias voltage for MOS-FETs 4 and 3, the continuity of the upper (positive half-cycle) and lower (negative half-cycle) waves of the current flowing through load 9 is smooth. Therefore, a composite output wave can be produced in which generation of switching distortion and cross-over distortion is suppressed.

It will be readily understood that the embodiment of the invention shown in FIG. 5 performs in the same manner as the embodiment shown in FIG. 3.

A further embodiment of the invention will be now described with reference to FIG. 6 in which parts and elements corresponding to those of FIG. 5 are identified by the same reference numerals and a detailed description thereof will be omitted.

In the embodiment of the invention shown in FIG. 6, the control signals for the respective variable current sources 25 and 27, each of which form part of a current mirror circuit, are separately detected. Thus, the connection point between the base of transistor 25a and diode 25c is grounded through a constant current circuit 29a, and the connection point between the base of transistor 27a and diode 27c is grounded through a constant current circuit 29b. The connection point between the source of MOS-FET 4 and resistor 7 is connected through a parallel connection of a diode 33 and a capacitor 34 for biasing the base of an NPN transistor 35 forming a voltage detecting and voltage-current converting circuit. The transistor 35 has its base further connected through a constant current circuit 36 to the positive power supply terminal $+V_B$, its emitter connected through a resistor 37 to the connection point between resistors 7 and 8, and its collector connected to the connection point of diode 25c to constant current circuit 29a. In this case, a current, in response to the voltage drop across resistor 7, appears at the collector of transistor 35 and is supplied to diode 25c. Therefore, the current flowing through diode 25c which forms part of the current mirror circuit is controlled by the current appearing at the collector of transistor 35. In this manner, the current flowing through transistor 25a is controlled. The connection point between the source of MOS-FET 3 and resistor 8 is connected through a parallel connection of a diode 38 and a capacitor 39 for biasing the base of a PNP transistor 40 forming a voltage detecting and voltage-current converting circuit. The transistor 40 has its base further connected through a constant current circuit 41 to the negative power supply terminal $-V_B$, its emitter connected through a resistor 42 to the connection point between resistors 8 and 7, and its collector connected to the connection point of diode 27c to constant current circuit 29b. In this case, a current in response to the voltage drop across resistor 8 appears at the collector of transistor 40 and is supplied to diode 27c. Therefore, the current flowing through diode 27c which forms part of the current mirror circuit is controlled by the current appearing at the collector of transistor 40 so as to control the current flowing through transistor 27a.

In the embodiment of the invention shown in FIG. 6, and in a similar manner to the embodiment shown in FIG. 5, the voltage drops across resistors 7 and 8 are detected and the currents flowing through transistors 25a and 27a forming the variable current sources 25 and 27 are respectively controlled by the detected signals. It will therefore be readily understood that the embodiment of FIG. 6 achieves the same operation and effect achieved by the embodiment of FIG. 5.

Figure 7:
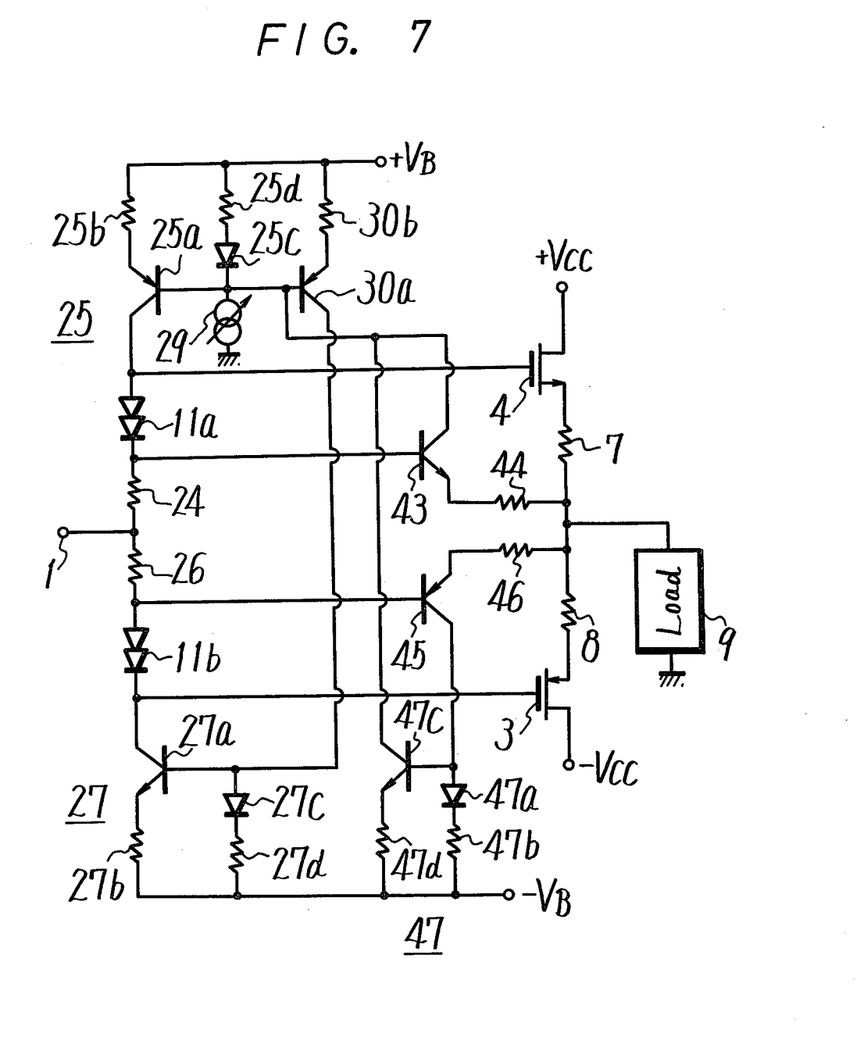
Figure 8:
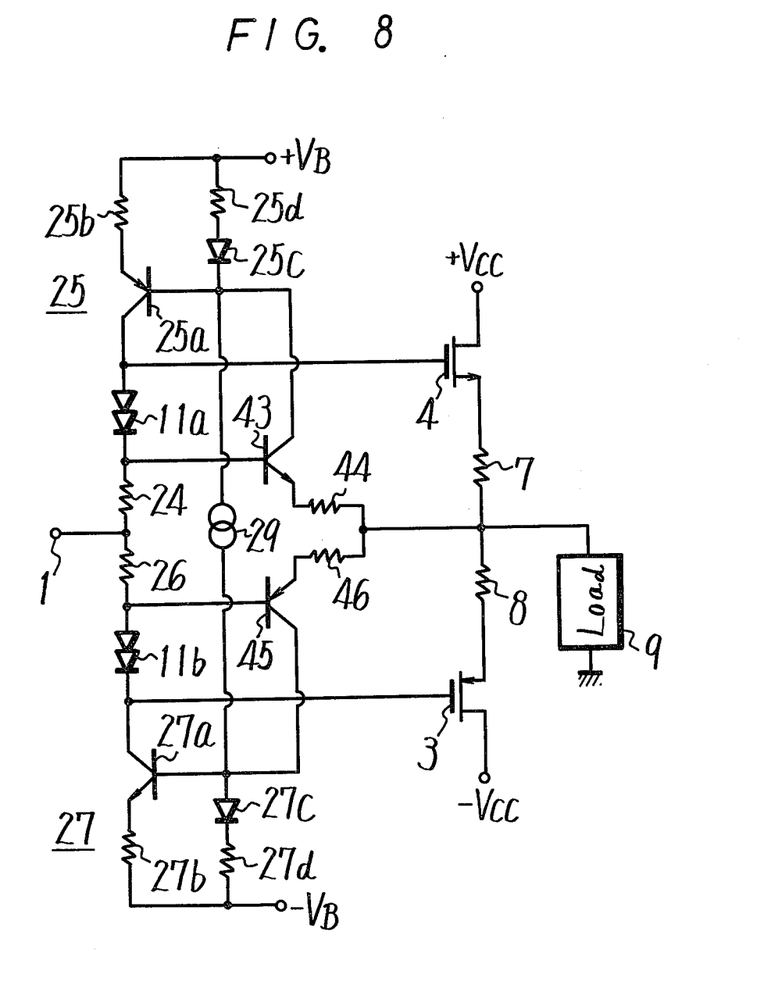

FIGS. 7 and 8 respectively show other embodiments of the invention. In the embodiments of the invention shown in FIGS. 3, 5 and 6, the voltage drops across resistors 7 and 8 are detected. However, in the embodiments of the invention shown in FIGS. 7 and 8, the voltages respectively applied to the gates of MOS-FETs 4 and 3 are detected to control their bias voltages. In this case, the variation of $\Delta V_{GS}$ by an increase of $\Delta I_L$ is also detected.

The embodiments shown in FIGS. 7 and 8 will now be described, in which parts and elements corresponding to those of FIGS. 3, 5 and 6 are identified by the same reference numerals, and a detailed description thereof will be omitted.

In the embodiment of the invention shown in FIG. 7, audio signal input terminal 1 is connected through a series connection of a bias voltage determining resistor 24 and a temperature compensating diode 11a to the gate of the N-channel MOS-FET 4 which, together with the P-channel MOS-FET 3, forms the SEPP circuit. The connection point between diode 11a and the gate of MOS-FET 4 is connected to the collector or control output electrode of PNP transistor 25a which forms the variable current source 25. The transistor 25a has its emitter connected through resistor 25b to the positive power supply terminal supplied with the positive DC voltage $+V_B$ and its base connected through a series connection of diode 25c and resistor 25d to the positive power supply terminal $+V_B$ and through bias determining constant current circuit 29 to ground. In this case, the constant current circuit 29 is constructed so that its current can be adjusted, and transistor 25a and diode 25c form a current mirror circuit, as set forth above.

Further, audio signal input terminal 1 is connected through the series connection of bias voltage determining resistor 26 and temperature compensating diode 11b to the gate of P-channel MOS-FET 3. The connection point between diode 11b and the gate of MOS-FET 3 is connected to the collector of an NPN transistor 27a which forms the variable current source 27. The transistor 27a has its emitter connected through resistor 27b to the negative power supply terminal supplied with the negative DC voltage $-V_B$ and its base connected through the series connection of diode 27c and resistor 27d to the negative power supply terminal $-V_B$. The transistor 27a and diode 27c form a current mirror circuit, as set forth above. The connection point between diode 25c and constant current circuit 29 is connected to the base of a PNP transistor 30a which has its emitter connected through a resistor 30b to the positive power supply terminal $+V_B$ and the collector serving as its output electrode and being connected to the connection point of the base of transistor 27a and diode 27c. In this case, diode 25c and transistor 30a form a current mirror circuit, and diode 25c and transistor 25a also form a current mirror circuit, as set forth above. Further, diode 27c supplied with the output current from transistor 30a, and transistor 27a, form a current mirror circuit, as set forth above. Therefore, the currents respectively flowing through transistors 25a, 30a and 27a are equal.

Further, the connection point of resistor 24 to diode 11a is connected to the base of an NPN transistor 43 which forms a portion of the voltage detecting and voltage-current converting circuit and which has its emitter connected through a resistor 44 to the connection point between the resistors 7 and 8 and its collector connected to connection point of diode 25c to constant current circuit 29. In this case, a current in response to the voltage at the connection point of resistor 24 to diode 11a can be obtained at the collector of transistor 43. Further, the connection point of resistor 26 to diode 11b is connected to the base of a PNP transistor 45 which forms a portion of the voltage detecting and voltage-current converting circuit and which has its emitter connected through a resistor 46 to the connection point between resistors 7 and 8 and its collector connected through a series connection of a diode 47a and a resistor 47b to the negative power supply terminal $-V_B$ and also to the base of an NPN transistor 47c. The latter transistor, together with diode 47a, form a current mirror circuit 47. The transistor 47c has its emitter connected through a resistor 47d to the negative power supply terminal $-V_B$ and its collector connected to the connection point of diode 25c to constant current circuit 29. In this case, a current in response to the voltage at the connection point of resistor 26 to diode 11b can be obtained at the collector of transistor 45, whereby current mirror circuit 47 serves as a phase inverting circuit for the current appearing at the collector of transistor 45. In this case, transistor 43 or 45 is supplied with a current in response to the gate voltage of either MOS-FET 4 or 3 to thereby control the current flowing through diode 25c which forms part of the aforementioned current mirror circuit, to also control the currents flowing through transistors 25a, 30a and 27a.

Also, in the embodiment of the invention shown in FIG. 7, the voltage $V_4$ between the gate of MOS-FET 4 and the connection point of resistor 7 to resistor 8, that is, the output terminal, and the voltage $V_3$ between the gate of MOS-FET 3 and the output terminal, are varied as shown in FIG. 4A. Therefore, the currents $I_a$ and $I_b$ flowing through MOS-FETs 4 and 3 are varied as shown in FIG. 4B so that MOS-FETs 4 and 3 are not cut off. Further, since the respective currents of transistors 25a and 27a are controlled by the output signals from transistors 43 and 45, which form the voltage detecting and voltage-current converting circuit and thereby, in turn control the bias voltage for MOS-FETs 4 and 3, the continuity of the upper and lower waves of the current flowing through load 9 is smooth. Therefore, a composite output wave can be produced in which generation of switching distortion and cross-over distortion is suppressed.

It should be readily understood that the embodiment of the invention shown in FIG. 7 obtains the same results as the embodiment shown in FIG. 3.

FIG. 8 shows a further embodiment of the invention which is provided by simplifying the embodiment of FIG. 7. In FIG. 8, elements and parts corresponding to those of FIG. 7 are identified by the same reference numerals and the detailed description thereof will be omitted.

In the embodiment of FIG. 8, the collector of transistor 45 is connected to the connection point between diode 27c and the base of transistor 27a to cause a current to flow through transistor 27a in response to the voltage appearing at the connection point between resistor 26 and diode 11b, and constant current circuit 29 for setting the bias current is connected between the bases of transistors 25a and 27a. With the embodiment of FIG. 8, since currents in response to the voltages across resistors 24 and 26 respectively flow through transistors 25a and 27a, it will be readily understood that the embodiment of FIG. 8 obtains the same operation and results as those of FIG. 7.

In the above embodiments of the invention, two resistors 24 and 26 are provided and the input signal is fed to the connection point therebetween. It is, however, possible that a single resistor can be used in place of the two resistors with the input signal being fed to both ends of the single resistor to obtain the same effect.

It may be also possible that, in place of the MOS-FETs serving as the output transistors, other types of transistors, such as bi-polar transistors and the like, can be used, if necessary, with the same effect.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

I claim as my invention:

1. A biasing circuit comprising:
   signal input means for supplying an input signal;
   output transistor means including first and second output transistors for amplifying said input signal, each of said transistors including an output path and an input;
   output resistive means including first and second resistive elements connected in series between the output paths of said first and second output transistors;

first and second variable current source means;

input resistive means connected between said first and second variable current source means for supplying said input signal to the inputs of said first and second output transistors; and control means for detecting the voltage at one of said output transistor means and said output resistive means and for controlling at least one of said first and second variable current source means in response to said detection.

2. A biasing circuit according to claim 1, in which said control means detects the voltages across said first and second resistive elements of said output resistive means and produces an output in response thereto, and said first and second variable current source means are simultaneously controlled by the output of said control means.

3. A biasing circuit according to claim 2, in which said first and second resistive elements include two terminals, a respective terminal of each of said first and second resistive elements being connected together at a connection point which constitutes a signal output terminal, and said control means includes an operational amplifier having positive and negative input terminals and an output terminal, the negative input terminal of which is connected to the terminal of said first resistive element which is remote from said signal output terminal, and the positive input terminal of which is connected to the terminal of said second resistive element which is remote from said signal output terminal.

4. A biasing circuit according to claim 3, in which said control means futher includes a converting transistor having an input electrode connected to the output terminal of said operational amplifier and an output electrode connected to said first and second variable current source means.

5. A biasing circuit according to claim 4, in which said converting transistor is of the NPN type and has a base, emitter and collector, the base of which is connected to said signal output terminal, the emitter of which is connected to the output terminal of said operational amplifier, and the collector of which simultaneously controls said first and second variable current source means.

6. A biasing circuit according to claim 5, in which said first variable current source means includes a first current mirror circuit having an input terminal connected to the output terminal of said operational amplifier and an output terminal connected to said input resistive means and the input of said first output transistor.

7. A biasing circuit according to claim 6, in which said second variable current source means includes:

a second current mirror circuit connected to said first current mirror circuit and having an input terminal connected to the output terminal of said operational amplifier and an output terminal; and a third current mirror circuit connected to said first and second current mirror circuits and having an input terminal connected to the output terminal of said second current mirror circuit and an output terminal connected to said input resistive means and the input of said second output transistor.

8. A biasing circuit according to claim 7, further included first and second DC voltage sources; and in which said input resistive means is connected to the inputs of said first and second output transistors; and said first current mirror circuit includes a first current mirror transistor having a base, emitter and collector, the emitter and collector of which are connected to said first DC voltage source and the connection point of said input resistive means with the input of said first output transistor, respectively, and first diode means connected between said first DC voltage source and the base of said first current mirror transistor, the connection point of said first diode means with the base of said first current mirror transistor being the input terinal of said first current mirror circuit, and the collector of said first current mirror transistor being the output terminal of said first current mirror circuit.

9. A biasing circuit according to claim 8, in which said second current mirror circuit includes a second current mirror transistor having a base, emitter and collector, the emitter and collector of which are connected to said first DC voltage source and the input terminal of said third current mirror circuit, respectively, and said first diode means is connected between the emitter and base of said second current mirror transistor.

10. A biasing circuit according to claim 9, in which said third current mirror circuit includes a third current mirror transistor having a base, emitter and collector, the collector and emitter of which are connected to the connection point of said input resistive means with the input of said second output transistor, and said second DC voltage source, respectively, and second diode means connected between the base and emitter of said third current mirror transistor, the connection point of said second diode means and the base of said third current mirror transistor being the input terminal of said third current mirror circuit, and the collector of said third current mirror transistor being the output terminal of said third current mirror circuit.

11. A biasing circuit according to claim 9, in which said first diode means includes a diode connected between the emitter and base of said second current mirror transistor in the forward biasing direction thereof.

12. A biasing circuit according to claim 9, further including a constant current circuit connected between the bases of said first and second current mirror transistors and a reference potential, respectively, to supply biasing currents to said first and second current mirror transistors.

13. A biasing circuit according to claim 10, in which said second diode means includes a diode connected between the base and emitter of said third current mirror transistor in the forward biasing direction thereof.

14. A biasing circuit according to claim 1, in which each of said first and second output transistors is a MOS field effect transistor.

15. A biasing circuit according to claim 1, in which said control means independently detects the voltages across said first and second resistive elements and produces respective outputs in response thereto, and said first and second variable current source means are independently controlled by the outputs of said control means.

16. A biasing circuit according to claim 15, in which said control means includes:

a first control transistor having a base, emitter and collector, the base and emitter of which are connected across said first resistive element; and a second control transistor having a base, emitter and collector, the base and emitter of which are connected across said second resistive element.

17. A biasing circuit according to claim 16, further including first and second DC voltage sources; and in which said input resistive means is connected to the inputs of said first and second output transistors; and said first variable current source means includes:
a first source transistor having a base, emitter and collector, the emitter and collector of which are connected between said first DC voltage source and the connection point of said input resistive means with the input of said first output transistor; first diode means connected between said first DC voltage source and the base of said first source transistor; and a first constant current circuit connected between the connection point of said first diode means with the base of said first source transistor, and a reference potential; and said control means includes a circuit connection between the collector of said first control transistor and the connection point of said first diode means with said first constant current circuit.

18. A biasing circuit according to claim 17, in which said second variable currrent source means includes:
a second source transistor having a base, emitter and collector, the collector and emitter of which are connected between the connection point of said input resistive means with the input of said second output transistor, and said second DC voltage source;
second diode means connected between said second DC voltage source and the base of said second source transistor; and
a second constant current circuit connected between the connection point of said second diode means with the base of said second source transistor, and said reference potential; and
said control means includes a circuit connection between the collector of said second control transistor and the connection point of said second constant current circuit with said second diode means.

19. A biasing circuit according to claim 18, in which said first resistive element is connected to said first output transistor and said second resistive element is connected to said second output transistor, and further including a series circuit of a third constant current circuit and third diode means connected between said first DC voltage source and the connection point of said first resistive element with said first output transistor, the conection point of said third constant current source to said third diode means being connected to the base of said first control transistor to supply a bias voltage thereto.

20. A biasing circuit according to claim 19, further including a series circuit of a fourth constant current circuit and fourth diode means connected between said second DC voltage source and the connection point of said second resistive element with said second output transistor, the connection point of said fourth constant current circuit to said fourth diode means being connected to the base of said second control transistor to supply a bias voltage thereto.

21. A biasing circuit according to claim 1, in which said first and second resistive elements are connected together at a connection point which constitutes a signal output terminal, said control means detects the voltage between the input of said first output transistor and said signal output terminal, and the voltage between the input of said second output transistor and said signal output terminal, and produces an output in response thereto, and said first and second variable current source means are simultaneously controlled by the output of said control means.

22. A biasing circuit according to claim 21, in which said control means includes a first control transistor having a base, emitter and collector, the base of which is conected to the input of said first output transistor and the emitter of which is connected to said signal output terminal; and a second control transistor having a base, emitter and collector, the base of which is connected to the input of said second output transistor and the emitter of which is connected to said signal output terminal.

23. A biasing circuit according to claim 22, in which said input resistive means is connected to the inputs of said first and second output transistors and said first variable current source means includes a first current mirror circuit having an input terminal connected to the collector of said first control transistor and an output terminal connected to the connection point of said input resistive means and the input of said first output transistor.

24. A biasing circuit according to claim 23, in which said second variable current source means includes a second current mirror circuit having an input terminal, and an output terminal connected to the connection point of said input resistive means and the input of said second output transistor.

25. A biasing circuit according to claim 24, in which said control means includes a third current mirror circuit having an input terminal connected to the collector of said first control transistor and an output terminal connected to the input terminal of said second current mirror circuit; and a fourth current mirror circuit having an input terminal connected to the collector of said second control transistor and an output terminal connected to the input terminal of said third current mirror circuit.

26. A biasing circuit according to claim 25, further including first and second DC voltage sources, and in which said first current mirror circuit includes:
a first current mirror transistor having a base, emitter and collector, the emitter and collector of which are connected between said first DC voltage source and the connection point of said input resistive means with the input of said first output transistor; and
first diode means connected between said first DC voltage source and the base of said first current mirror transistor; the connection point of said first diode means and the base of said first current mirror transistor being the input terminal of said first current mirror circuit and the collector of said first current mirror transistor being the output terminal of said first current mirror circuit.

27. A biasing circuit according to claim 26, in which said second current mirror circuit includes:
a second current mirror transistor having a base, emitter and collector, the collector and emitter of which are connected between the connection point of said input resistive means with the input of said second output transistor, and said second DC voltage source; and
second diode means connected between the base of said second current mirror transistor and said second DC voltage source; the connection point of the base of said second current mirror transistor and said second diode means being the input terminal of said second current mirror circuit and the collector of said second current mirror transistor being the output terminal of said second current mirror circuit.

28. A biasing circuit according to claim 27, in which said third current mirror circuit includes:
a third current mirror transistor having a base, emitter and collector, the emitter and base of which are connected between the first DC voltage source and the connection point of said second diode means with the base of said second current mirror transistor, said first diode means being connected between the first DC voltage source and the base of said third current mirror transistor, the connection point of said first diode means and the base of said third current mirror transistor being the input terminal of said third current mirror circuit and the collector of said third current mirror transistor being the output terminal of said third current mirror circuit.

29. A biasing circuit according to claim 21, in which each of said first and second output transistors is a MOS field effect transistor.

30. A biasing circuit according to claim 26, further including a constant current circuit connected between the input terminals of said first and third current mirror circuits and a reference potential to supply a bias current to said first and third current mirror circuits.

31. A biasing circuit according to claim 28, in which said fourth current mirror circuit includes:
a fourth current mirror transistor having a base, emitter and collector, the collector and emitter of which are connected between the connection point of said first diode means with the base of said third current mirror transistor, and said second DC voltage source; and
third diode means connected between the base of said fourth current mirror transistor and said second DC voltage source; the connection point of said third diode means with the base of said fourth current mirror transistor being the input terminal of said fourth current mirror circuit and the collector of said fourth current mirror transistor being the output terminal of said fourth current mirror circuit.

32. A biasing circuit according to claim 1, in which said first and second resistive elements are connected together at a connection point which constitutes a signal output terminal, said control means independently detects the voltages between the inputs of said first and second output transistors and said signal output terminal and produces a respective outputs in response thereto, and said first and second variable current source means are independently controlled by the respective outputs of said control means.

33. A biasing circuit according to claim 32, in which said control means includes a first control transistor having a base, emitter and collector; the base of which is connected to the input of said first output transistor and the emitter of which is connected to said signal output terminal; and a second control transistor having a base emitter and collector, the base of which is connected to the input of said second output transistor and the emitter of which is connected to said signal output terminal.

34. A biasing circuit according to claim 33, in which said input resistive means is connected to the inputs of said first and second output transistors and said first variable current source means includes a first current mirror circuit having an input terminal connected to the collector of said first control transistor and an output terminal connected to the connection point of said input resistive means with the input of said first output transistor.

35. A biasing circuit according to claim 34, in which said second variable current source means includes a second current mirror circuit having an input terminal connected to the collector of said second control transistor and an output terminal connected to the connection point of said input resistive means with the input of said second output transistor.

36. A biasing circuit according to claim 35, in which said control means includes a circuit connection between the collector of said first control transistor and the input terminal of said first current mirror circuit; and a circuit connection between the collector of said second control transistor and the input terminal of said second current mirror circuit.

37. A biasing circuit according to claim 34, further including first and second DC voltage sources, and in which said first current mirror circuit includes:
a first current mirror transistor having a base, emitter and collector, the emitter and collector of which are connected between said first DC voltage source and the connection point of said input resistive means with the input of said first output transistor; and
first diode means connected between said first DC voltage source and the base of said first current mirror transistor; the connection point of said first diode means and the base of said first current mirror transistor being the input terminal of said first current mirror circuit and the collector of said first current mirror transistor being the output terminal of said first current mirror circuit.

38. A biasing circuit according to claim 35, in which said second current mirror circuit includes:
a second current mirror transistor having a base, emitter and collector, the collector and emitter of which are connected between the connection point of said input resistive means with the input of said second output transistor, and said second DC voltage source; and
second diode means connected between the base of said second current mirror transistor and said second DC voltage source; the connection point of the base of said second current mirror transistor and said second diode means being the input terminal of said second current mirror circuit and the collector of said second current mirror transistor being the output terminal of said second current mirror circuit.

39. A biasing circuit according to claim 35, further including a constant current source connected between the input terminals of said first and second current mirror circuits to supply a bias current thereto.

40. A biasing circuit according to claim 32, in which each of said first and second output transistors is a MOS field effect transistor.

41. A biasing circuit according to claim 40, in which said MOS field effect transistors are connected between third and fourth DC voltage sources in a complementary push-pull relationship.

42. A biasing circuit according to any one of claims 1, 15, 21 or 32, in which said input resistive means includes a first resistor and at least one diode for use in temperature compensation, said at least one diode being connected between said first resistor and the inputs of said first and second output transistors.

* * * * *